United States Patent [19]

Tsujimoto et al.

[11] Patent Number: 5,295,621
[45] Date of Patent: Mar. 22, 1994

[54] METHOD OF SOLDERING USING A SPECIAL ATMOSPHERIC GAS

[75] Inventors: Yoshiharu Tsujimoto, Sanda; Iku Takenaka, Otsu; Hiromitsu Onishi, Itami, all of Japan; Edward K. Chang, Gillette, N.J.

[73] Assignee: Osaka Sanso Kogyo Ltd., Osaka, Japan

[21] Appl. No.: 988,565

[22] Filed: Dec. 10, 1992

[30] Foreign Application Priority Data

Dec. 20, 1991 [JP] Japan .................. 3-338422

[51] Int. Cl.⁵ ............................................. H05K 3/34
[52] U.S. Cl. ..................................... 228/219; 228/224
[58] Field of Search ................. 228/179, 180.2, 219, 228/224, 248

[56] References Cited

U.S. PATENT DOCUMENTS

| | | |
|---|---|---|
| 4,240,574 | 12/1980 | Schmatz et al. .................. 228/219 |
| 4,332,342 | 6/1982 | van Der Put .................. 228/180.2 |
| 4,610,391 | 9/1986 | Nowotarski .................. 228/219 |
| 5,071,058 | 12/1991 | Nowotarski .................. 228/219 |
| 5,121,875 | 6/1992 | Hagerty et al. .................. 228/219 |

*Primary Examiner*—Samuel M. Heinrich
*Attorney, Agent, or Firm*—David M. Rosenblum; Larry R. Cassett

[57] ABSTRACT

A method of soldering for surface mounting of a printed circuit board, which comprises performing reflow soldering with a rosin-based cream solder in a special atmospheric gas comprising an inert gas such as $N_2$, Ar or He and containing about 10,000 ppm or less of oxygen and 0.5–3.0% of moisture is disclosed.

3 Claims, 9 Drawing Sheets

METHOD OF SOLDERING USING A SPECIAL ATMOSPHERIC GAS

BACKGROUND OF THE INVENTION

This invention relates to a soldering method and a gas feeding method for use in mounting electronic parts on a packaged printed circuit board for an electronic circuit by reflow soldering. These methods upgrade the quality of a soldering procedure.

So far the soldering of electronic parts has been performed in an airy atmosphere with the use of a rosin-based cream solder, thus requiring the use of a high-activity flux. The cream solder using the high-activity flux is satisfactory in soldering property, but produces a large amount of residue. Because of this questionable reliability, etc., it needs to be washed with freon or the like. Freon used in the washing step, however, leads to environmental pollution, and its use has been restricted. In an attempt to eliminate the washing step, a cream solder containing a low-activity flux has been developed. A non-washing method which performs soldering using such a cream solder in an inert gas such as nitrogen gas has recently come into practical use.

When a rosin-based cream solder containing a flux with a low solids content is used, reflow soldering is carried out in a nitrogen atmosphere. This soldering procedure in a nitrogen atmosphere enhances soldering property, and generates minimal residue because of a low activity. The low activity, however, may lead to the occurrence of "solder balls," and if many such solder balls develop, a washing step becomes necessary irrespective of minimal residue. A cream solder for a fine pitch comprises small solder particles, and have a higher possibility of producing solder balls.

SUMMARY OF THE INVENTION

The present invention aims to make the occurrence of solder balls less frequent and the quality (e.g. persistent strength) of a soldering better than in a soldering method performed in a nitrogen gas atmosphere using a rosin-cream solder containing a flux with a low solids content. The invention is also intended to attain a better soldering quality by performing soldering with a rosin-based cream solder or a fine pitch cream solder in a special atmospheric gas rather than in air as employed in a customary practice.

The present invention relates to a method of soldering for surface mounting of a printed circuit board, which comprises performing reflow soldering with a rosin-based cream solder in a special atmospheric gas comprising an inert gas such as $N_2$, Ar or He and containing about 10,000 ppm or less of oxygen and 0.5–3.0% of moisture.

EXPLANATIONS FOR REFERENCE NUMERALS

Figure 1:
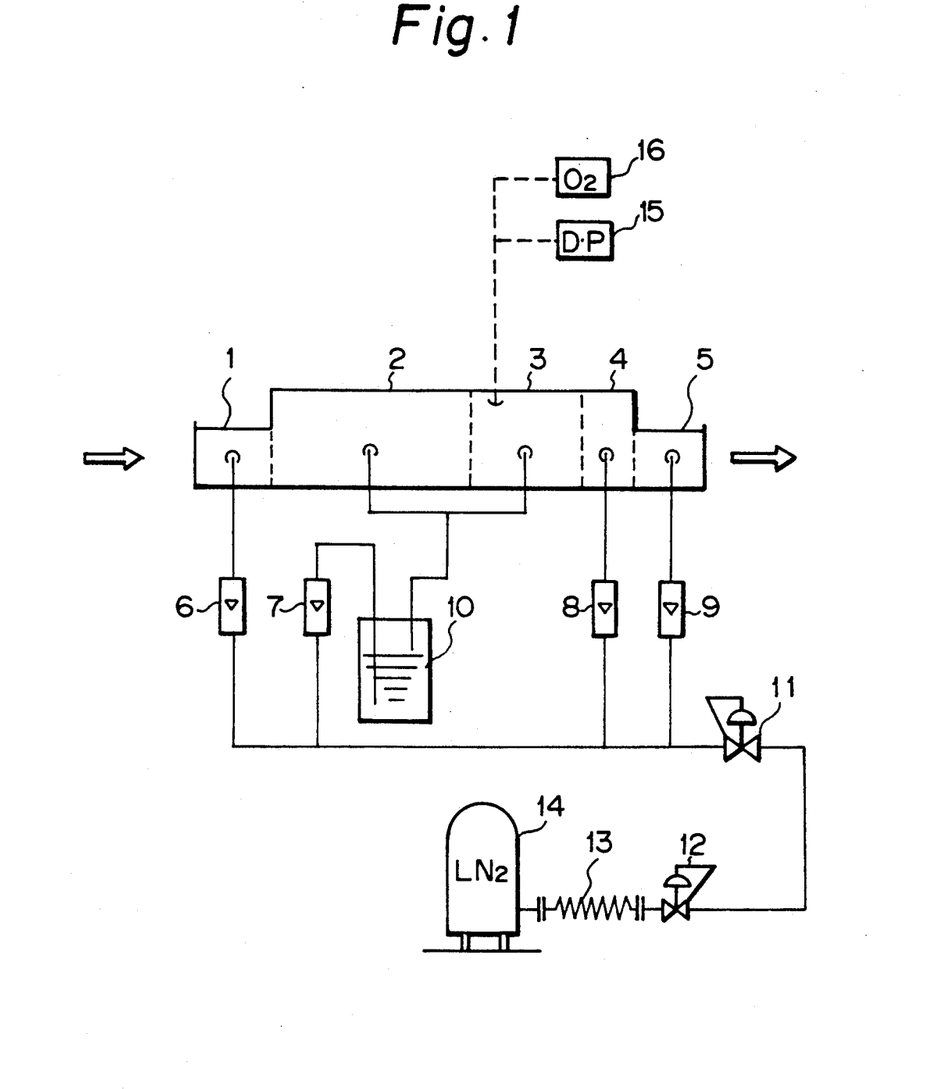
FIG. 1 is an outline view of a preferred embodiment of the present invention.
Figure 2:
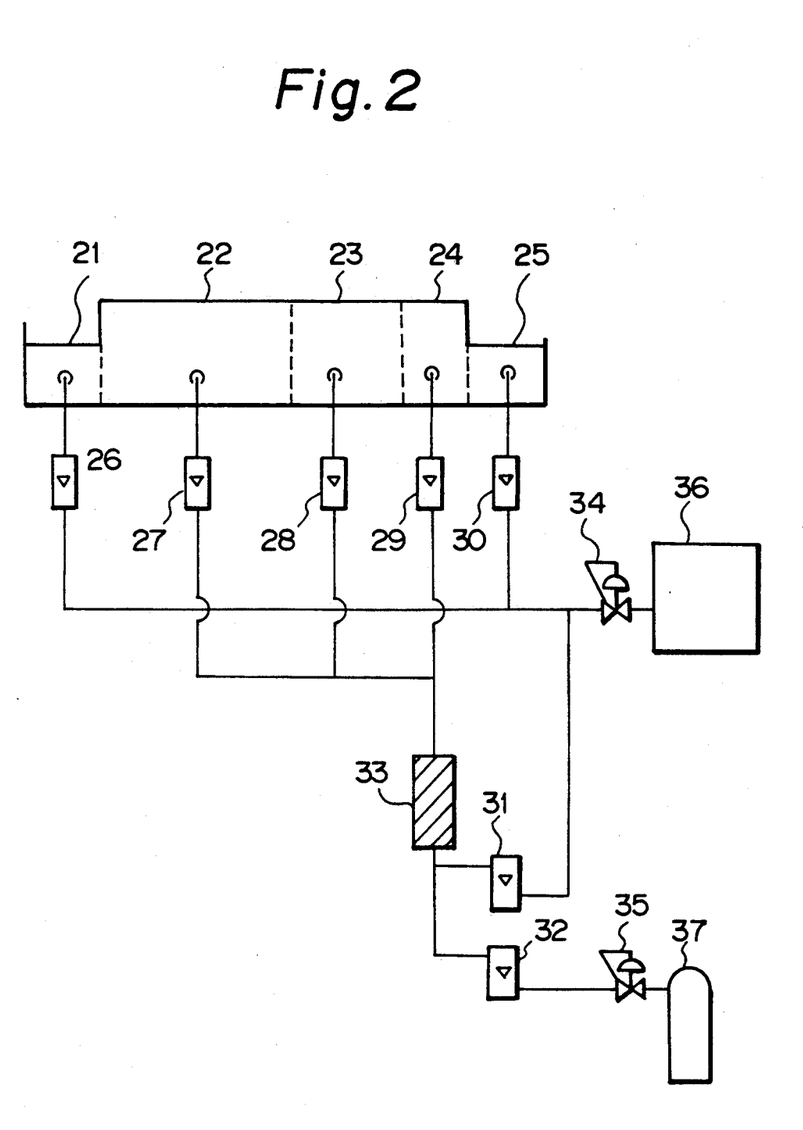
FIG. 2 is an outline view of a preferred embodiment of the present invention.

Inlet curtain portion is shown at 1; Preheating portion is shown at 2; Reflow soldering portion is shown at 3; Cooling portion is shown at 4; Outlet curtain portion is shown at 5; $N_2$ flowmeter connected to inlet curtain is shown at 6; Flowmeter for $N_2$ to be moistened is shown at 7; $N_2$ flowmeter for cooling portion is shown at 8; Flowmeter connected to outlet curtain is shown at 9; Humidifier is shown at 10; Secondary pressure reducing valve is shown at 11; Primary pressure reducing valve is shown at 12; Evaporator is shown at 13; $LN_2$ tank is shown at 14; Dewpoint hygrometer is shown at 15; Oxygen meter is shown at 16; Inlet curtain portion is shown at 21; Preheating portion is shown at 22; Reflow soldering portion is shown at 23; Cooling portion is shown at 24; Outlet curtain portion is shown at 25; $N_2$ flowmeter connected to inlet curtain is shown at 26; $N_2$ flowmeter for preheating portion is shown at 27; $N_2$ flowmeter for reflow soldering portion is shown at 28; $N_2$ flowmeter cooling portion is shown at 29; $N_2$ flowmeter connected to outlet curtain is shown at 30; $N_2$ flowmeter is shown at 31; $H_2$ flowmeter is shown at 32; Catalyst tube is shown at 33; $N_2$ pressure reducing valve is shown at 34; $H_2$ pressure reducing valve is shown at 35; $N_2$ generator is shown at 36; $H_2$ gas is shown at 37.

The special atmospheric gas is introduced into the reflow soldering furnace by the following methods.

(1) High-purity nitrogen gas obtained by vaporizing liquid nitrogen by means of an evaporator is passed through a humidifier, and the nitrogen gas containing water vapor is charged into the reflow soldering furnace.

(2) Low-purity nitrogen gas generated by a nitrogen generator (PSA, a membrane-equipped apparatus) is passed through a catalyst, where residual oxygen and $H_2$ are reacted to generate moisture, and at the same time, remove the residual oxygen. Then, the nitrogen gas is introduced into the reflow soldering furnace.

If the oxygen concentration in the special atmospheric gas used in the present invention exceeds 10,000 ppm or the moisture content of the special atmospheric gas is outside the range 0.5–3.0%, the number of solder balls will increase, or the soldering strength will decrease.

PREFERABLE EMBODIMENTS

Embodiments of the present invention will be described in detail with reference to the appended drawings.

FIG. 1 illustrates a method of introducing the special atmospheric gas relevant to the invention into a reflow soldering furnace with the use of liquefied nitrogen and a humidifier. FIG. 2 shows a method of feeding the special atmospheric gas, which comprises low-purity nitrogen gas generated by a nitrogen generator (PSA, a membrane-equipped apparatus) and $H_2$ gas into a reflow soldering furnace after passage through a catalyst.

In FIG. 1, liquid nitrogen from a liquid nitrogen tank 14 is passed through an evaporator 13 for vaporization. The so produced nitrogen gas is led to nitrogen flowmeters 6, 8, 9, and fed at a controlled flow rate into an inlet curtain portion 1, a cooling portion 4, and an outlet curtain portion 5 of a reflow soldering furnace. A special atmospheric gas is flowed into a preheating portion 2 and a reflow soldering portion 3. The special atmospheric gas fed into the reflow soldering furnace has been obtained by passing the above-mentioned nitrogen gas into a humidifier 10 to give it moisture there. The moisture content of the nitrogen gas is controlled by the amount of water, the water temperature, and $N_2$ gas flow rate in the humidifier 10 so that a moisture content of 0.5-3.0% is attained in the reflow soldering furnace.

The amount of moisture in the furnace is measured by a dew-point hygrometer 15. The flow rate of each gas is controlled so that the oxygen concentration in the furnace as measured by an oxygen meter 16 becomes 10,000 ppm or less.

In FIG. 2, low-purity nitrogen gas ($O_2$ content: 0.5-1.0%) generated by a nitrogen generator 36 and $H_2$ gas at a flow rate controlled by a flowmeter are passed through a catalyst tube 33. There, the residual oxygen and $H_2$ are reacted to remove the residual oxygen and generate moisture simultaneously. By this method, the amount of nitrogen gas generated by the nitrogen generator and the amount of $H_2$ gas added are controlled using an oxygen meter and a dewpoint hygrometer so that the oxygen concentration in the reflow soldering furnace will be 10,000 ppm or less and the moisture content therein 0.5-3.0%. In this case, the inlet curtain and the outlet curtain are intended for preventing the penetration of air from the outside; therefore, the low-purity nitrogen gas generated by the nitrogen generator 36 is poured unchanged into these curtain portions, while the special atmospheric gas produced in the above manner is fed into the other portions.

In accordance with the method illustrated in FIG. 1, the special atmospheric gas was flowed into the reflow soldering furnace, where an RMA cream solder containing a flux with a low solids content was reflow-soldered in a furnace atmosphere with an oxygen concentration of 3 ppm to 21%, a moisture content of 1.5%, and the remainder being nitrogen. Then, the number of solder balls, the soldered joint strength, and the solder spreading rate were measured.

Figure 3:
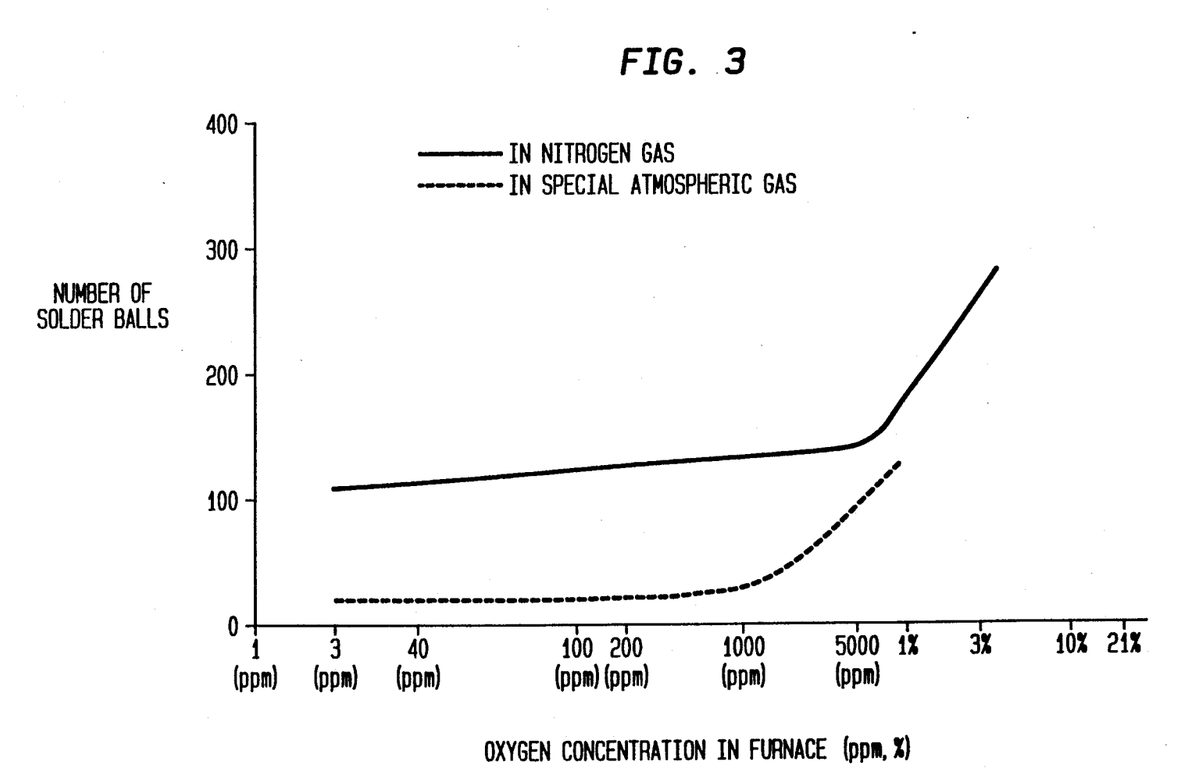
FIG. 3 is a graph showing comparisons in the number of solder balls produced with a rosin-based cream solder containing a flux with a low solids content.
Figure 4:
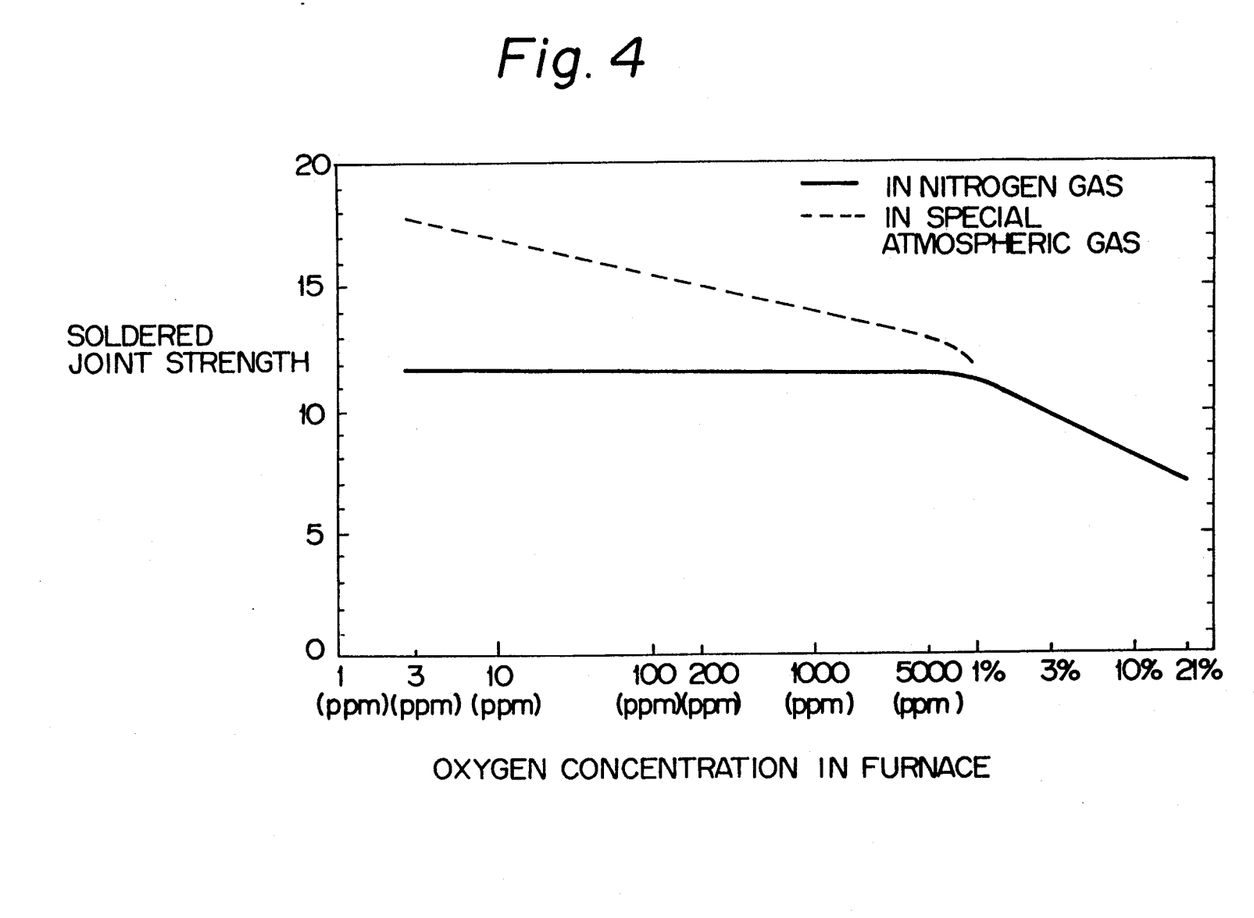
FIG. 4 is a graph showing comparisons in the soldered joint strength obtained with a rosin-based cream solder containing a flux with a low solids content.
Figure 5:
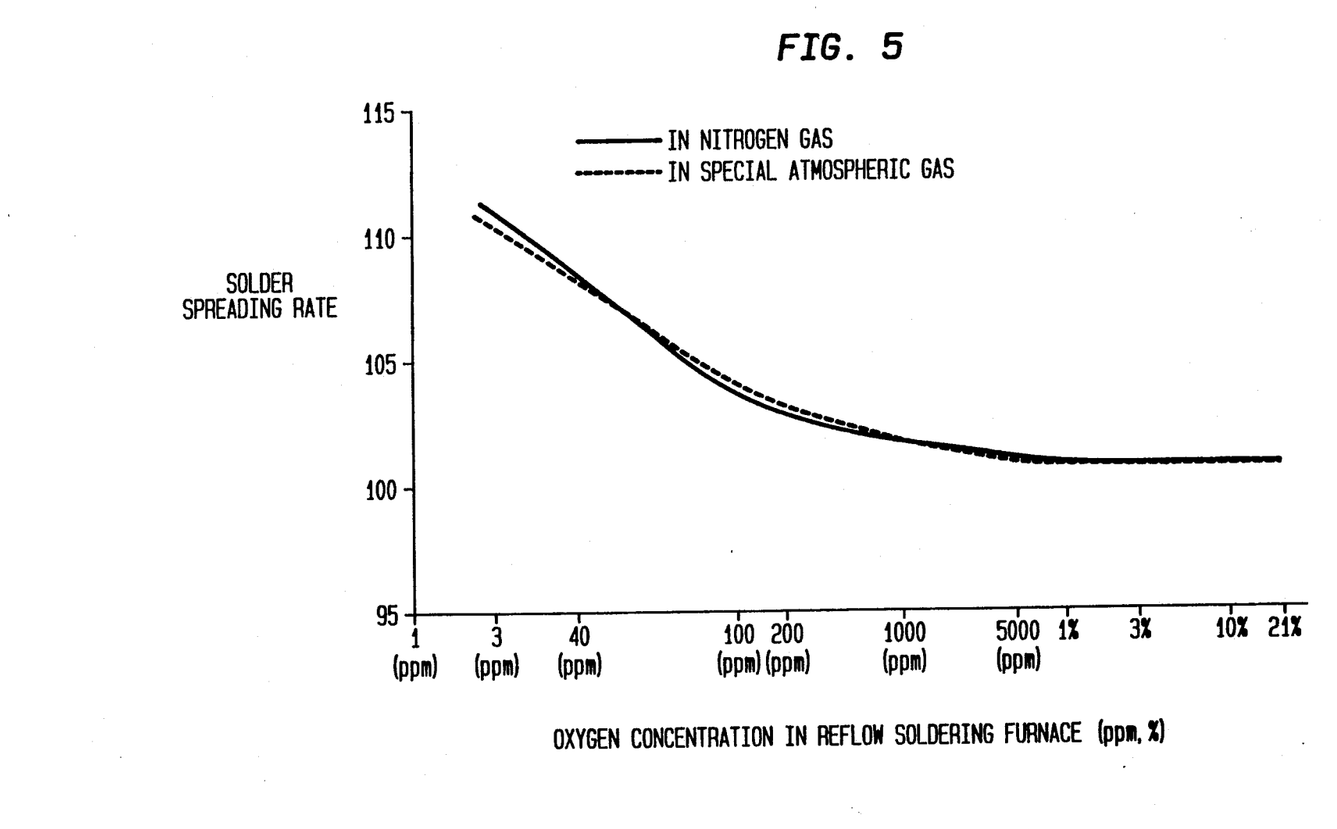
FIG. 5 is a graph showing comparisons in the solder spreading rate obtained with a rosin-based cream solder containing a flux with a low solids content.

FIG. 3 shows the number of solder balls, FIG. 4 the soldered joint strength, and FIG. 5 the solder spreading rate. The solid line and the dotted line in each of FIGS. 3 to 5 represent the results obtained in nitrogen gas and the special atmospheric gas, respectively.

The solder spreading rate showed no differences between nitrogen gas and the special atmospheric gas, while the number of solder balls and the soldered joint strength showed improvements in the case of the special atmospheric gas.

The following table reveals comparisons in terms of soldered joint strength between soldering in nitrogen gas and that in the special atmospheric gas (oxygen concentration 200 ppm, moisture content 1.5%), both at a furnace oxygen concentration of 200 ppm and with a cream solder thickness of 150 $\mu$m or 100 $\mu$m.

TABLE 1

| Atmosphere | Soldered joint strength | |
|---|---|---|
| | Cream solder thickness | |
| | 150 $\mu$m | 100 $\mu$m |
| Nitrogen gas | 11.5 kg | 8.7 kg |
| Special atmosphere gas | 14.8 kg | 11.3 kg |

Oxygen concentration in the furnace: 200 ppm

The fine pitching of parts is decreasing the amount of the cream solder, and also tends to cause more solder balls. By soldering in the special atmospheric gas, a higher joint strength can be secured even when the amount of the cream solder is decreased (solder thickness: 150 $\mu$m→100 $\mu$m).

In accordance with the method illustrated in FIG. 1, a conventional rosin-based cream solder (including that for a fine pitch) was reflow-soldered in a furnace atmosphere with an oxygen concentration of 3 ppm to 21%, a moisture content of 1.5%, and the remainder being nitrogen. Then, the number of solder balls, the soldered joint strength, and the solder spreading rate were measured.

Figure 6:
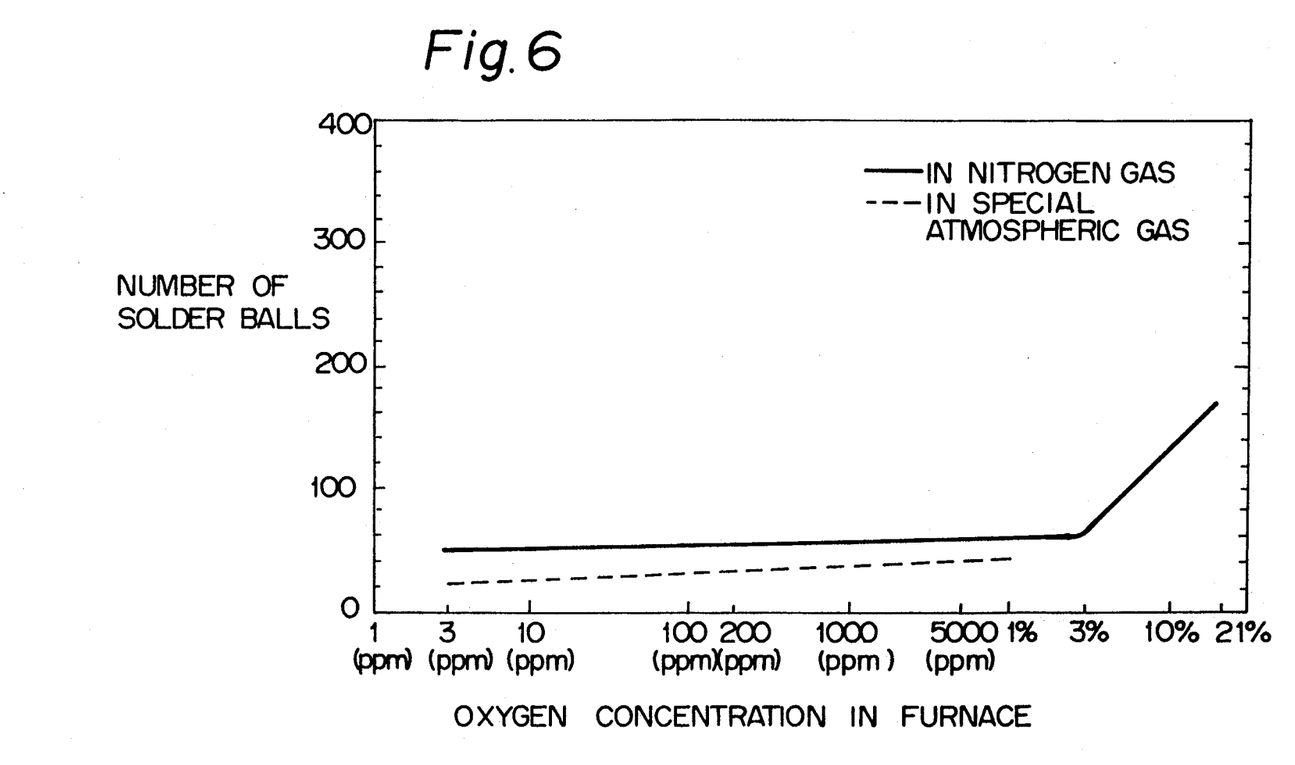
FIG. 6 is a graph showing comparisons in the number of solder balls produced with a conventional rosin-based cream solder.
Figure 7:
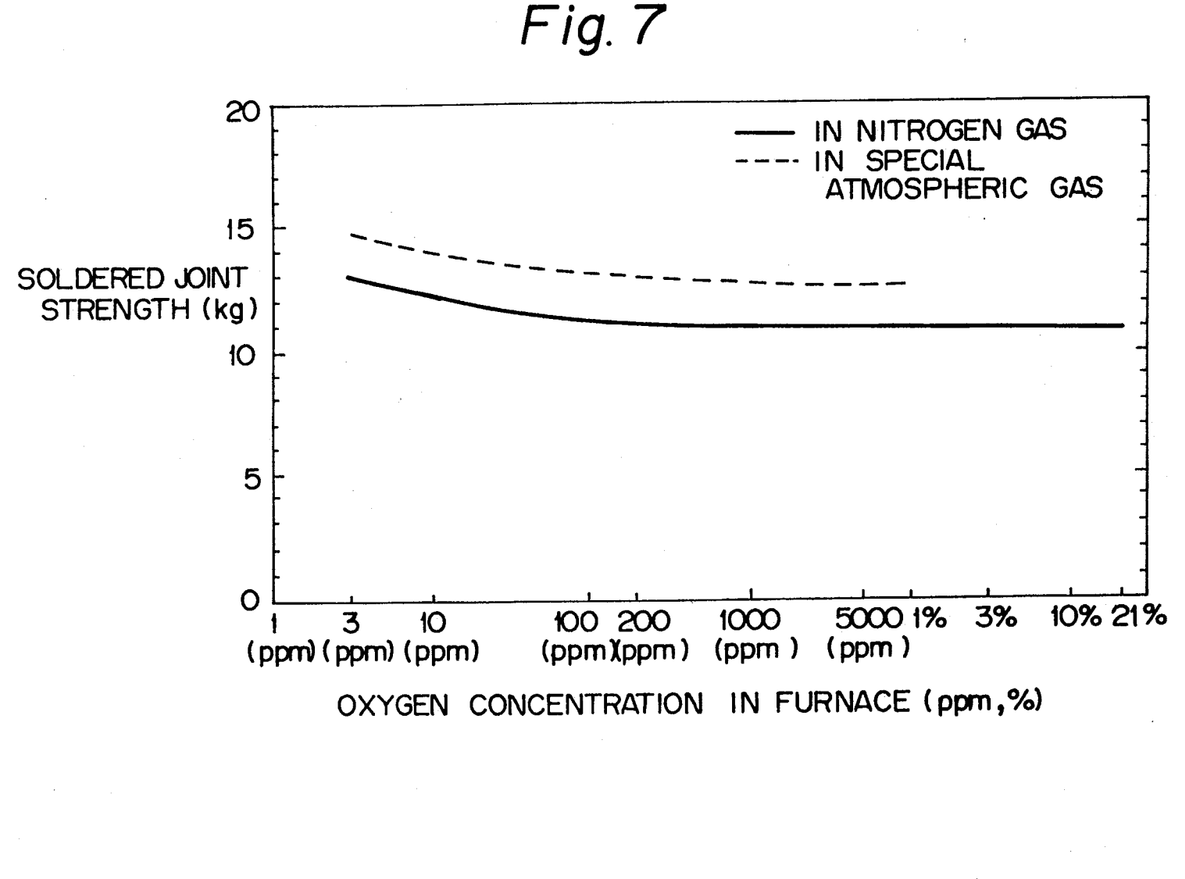
FIG. 7 is a graph showing comparisons in the soldered joint strength obtained with a conventional rosin-based cream solder.
Figure 8:
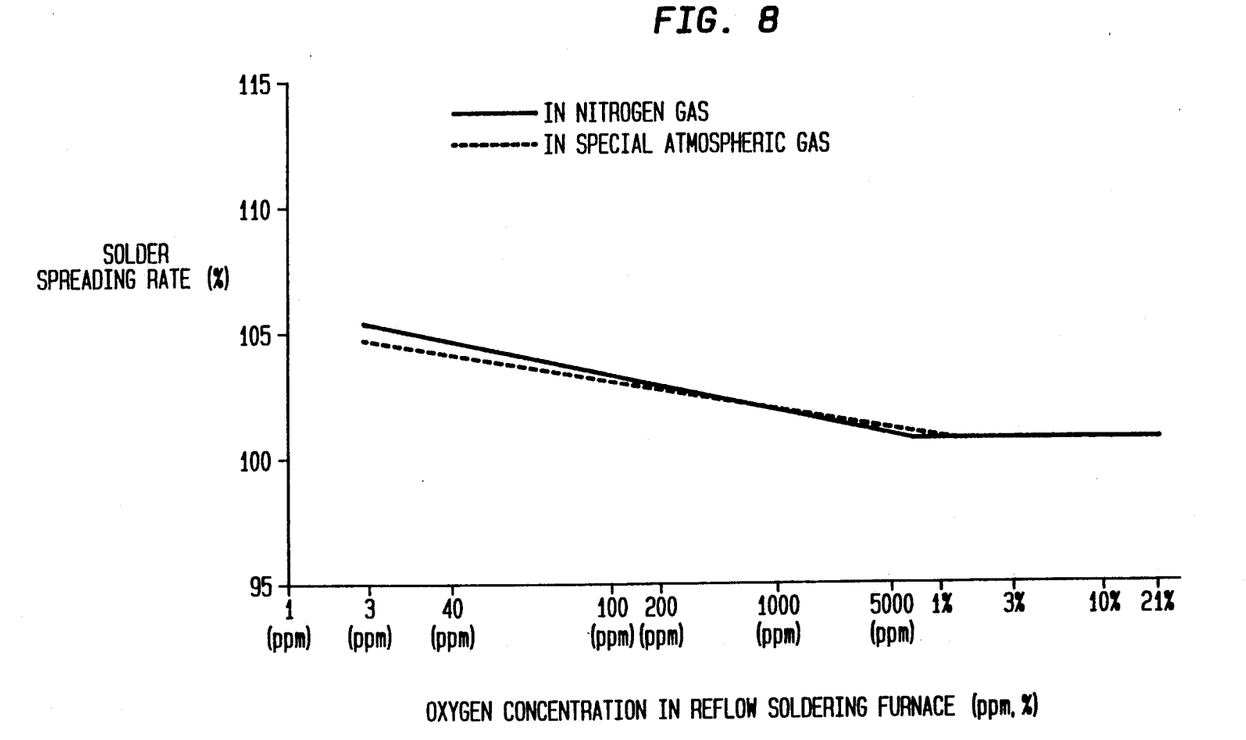
FIG. 8 is a graph showing comparisons in the solder spreading rate obtained with a conventional rosin-based cream solder.

FIG. 6 shows the number of solder balls, FIG. 7 the soldered joint strength, and FIG. 8 the solder spreading rate. The solid line and the dotted line in each of FIGS. 6 to 8 represent the results obtained in nitrogen gas and the special atmospheric gas, respectively.

The solder spreading rate showed no differences between nitrogen gas and the special atmospheric gas, while the number of solder balls and the soldered joint strength showed improvements in the case of the special atmospheric gas.

Figure 9:
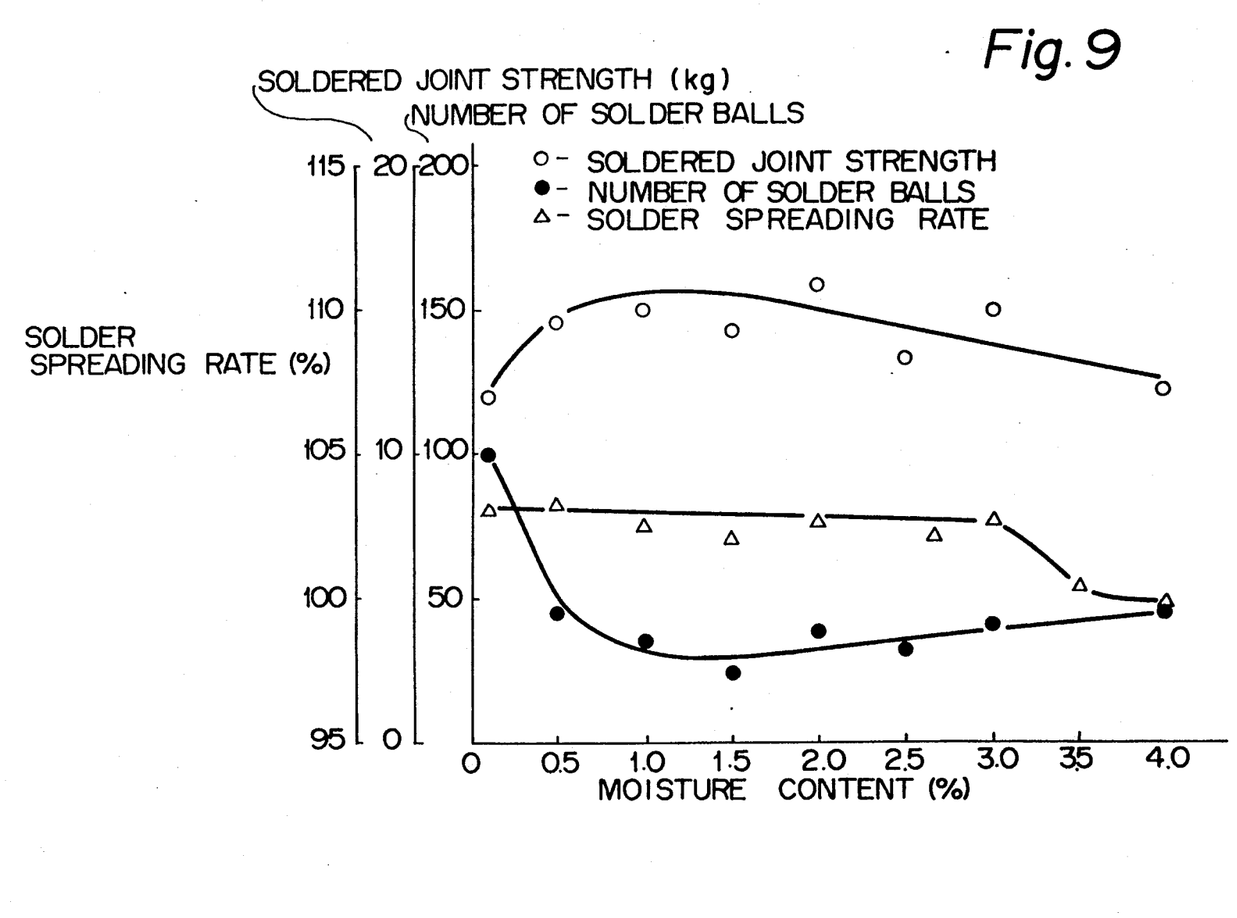
FIG. 9 is a graph showing the relationships between the moisture content and each of the soldered joint strength, the number of solder balls, and the solder spreading rate.

In accordance with the method illustrated in FIG. 1, a rosin-based cream solder containing a flux with a low solids content was reflow-soldered with the oxygen concentration in the reflow soldering furnace being set at 200 ppm and the moisture content being changed as follows: 0.1, 0.5, 1.0, 1.5, 2.0, 2.5, 3.0 and 4.0%. Then, the number of solder balls, the soldered joint strength, and the solder spreading rate were measured. The number of solder balls decreased at a moisture content of 0.5% or more. The soldered joint strength increased at a moisture content of 0.5% or more. The solder spreading rate began to decrease at a moisture content of 3% or more. These results are shown in FIG. 9.

What is claimed is:

1. A method of soldering a packaged printed circuit board, which comprises performing reflow soldering with a rosin-based cream solder in a special atmosphere gas comprising an inert gas and containing no more than about 10,000 ppm of oxygen and 0.5-3.0% of moisture.

2. A method of soldering, which comprises performing reflow soldering in a special atmospheric gas with the use of a rosin-based cream solder containing a flux with a particularly low solid content, said special atmospheric gas comprising an inert gas and containing no more than about 10,000 ppm of oxygen and 0.5-3.0% of moisture.

3. The method of claim 1 or 2 wherein said inert gas is selected from the group consisting of $N_2$, Ar and He.

* * * * *